US010400315B2

(12) United States Patent
Del Frate et al.

(10) Patent No.: US 10,400,315 B2

(45) Date of Patent: Sep. 3, 2019

(54) COLD ROLLED STEEL SHEET AND VEHICLE

(71) Applicant: ArcelorMittal Investigación y Desarrollo SL, Sestao, Bizkaia (ES)

(72) Inventors: Franco Del Frate, Fameck (FR); Jean-Michel Mataigne, Senlis (FR); Jonas Staudte, Montigny-lès-Metz (FR); Astrid Perlade, Le Ban-Saint-Martin (FR); Ian Alberto Zuazo-Rodriguez, Metz (FR)

(73) Assignee: ARCELORMITTAL INVESTIGACIÓN Y DESARROLLO, S.L., Sestao, Bizkaia (ES)

(*) Notice: Subject to any disclaimer, the term of this patent is extended or adjusted under 35 U.S.C. 154(b) by 541 days.

(21) Appl. No.: 14/901,931

(22) PCT Filed: Jul. 3, 2014

(86) PCT No.: PCT/IB2014/001258

§ 371 (c)(1),
(2) Date: Dec. 29, 2015

(87) PCT Pub. No.: WO2015/001414

PCT Pub. Date: Jan. 8, 2015

(65) Prior Publication Data

US 2016/0194739 A1 Jul. 7, 2016

(30) Foreign Application Priority Data

Jul. 3, 2014 (WO) .................. PCT/IB2014/001258

(51) Int. Cl.

*C22C 38/38* (2006.01)
*C22C 38/24* (2006.01)

(Continued)

(52) U.S. Cl.

CPC ........... *C22C 38/38* (2013.01); *B22D 11/001* (2013.01); *B32B 15/013* (2013.01); *B32B 15/04* (2013.01);

(Continued)

(58) Field of Classification Search

CPC ...... C21D 1/74; C21D 8/0236; C21D 8/0278; C21D 9/52; C21D 8/0226;

(Continued)

(56) References Cited

U.S. PATENT DOCUMENTS 8,216,695 B2 7/2012 Nakanishi et al.
8,409,667 B2 4/2013 Bordignon et al.

(Continued)

FOREIGN PATENT DOCUMENTS

BE 1014997 A3 8/2004
CN 101501235 A 8/2009

(Continued)

*Primary Examiner* — Michael E. La Villa

(74) *Attorney, Agent, or Firm* — Davidson, Davidson & Kappel, LLC

(57) ABSTRACT

A cold rolled and hot dip coated steel sheet presenting a tensile strength above 1000−50×Al MPa, a uniform elongation above 15% and a low density is provided. The steel includes, by weight percent:

$0.1 \le C \le 0.5\%$, $3.5 \le Mn \le 10.0\%$, $0 \le Al \le 9.0\%$, $Si \le 5.0\%$, $Ti \le 0.2\%$, $V \le 0.2\%$, $Nb \le 0.2\%$, $S \le 0.004\%$, $P \le 0.025\%$, $0.5 \le Si+Al \le 9.0\%$, $B \le 0.0035$, $Cr \le 1\%$,

The balance being Fe and impurities and the microstructure containing 25% to 90% of ferrite, 10% to 50% of austenite, kappa precipitates lower than 5% and martensite lower than 25%. The steel is able to be coated using total oxidation.

22 Claims, 5 Drawing Sheets

(51) Int. Cl.

| | |
|---|---|
| ***C22C 38/28*** | (2006.01) |
| ***C22C 38/06*** | (2006.01) |
| ***C22C 38/26*** | (2006.01) |
| ***C22C 38/02*** | (2006.01) |
| ***C22C 38/00*** | (2006.01) |
| ***C23C 2/02*** | (2006.01) |
| ***C23C 2/06*** | (2006.01) |
| ***C23C 14/24*** | (2006.01) |
| ***C23C 14/02*** | (2006.01) |
| ***C23C 14/14*** | (2006.01) |
| ***C25D 3/22*** | (2006.01) |
| ***C25D 5/36*** | (2006.01) |
| ***C21D 9/46*** | (2006.01) |
| ***C21D 8/02*** | (2006.01) |
| ***C21D 6/00*** | (2006.01) |
| ***B22D 11/00*** | (2006.01) |
| ***C23C 30/00*** | (2006.01) |
| ***C23C 2/26*** | (2006.01) |
| ***C23C 28/02*** | (2006.01) |
| ***C23C 28/00*** | (2006.01) |
| ***C23C 2/04*** | (2006.01) |
| ***C23C 2/12*** | (2006.01) |
| ***C23C 14/58*** | (2006.01) |
| ***B32B 15/01*** | (2006.01) |
| ***B32B 15/04*** | (2006.01) |
| ***C23C 14/16*** | (2006.01) |
| ***C22C 38/44*** | (2006.01) |
| ***C22C 38/34*** | (2006.01) |
| ***C22C 38/18*** | (2006.01) |
| ***C22C 38/50*** | (2006.01) |
| ***C22C 38/48*** | (2006.01) |
| ***C22C 38/58*** | (2006.01) |
| ***C22C 38/14*** | (2006.01) |
| ***C22C 38/12*** | (2006.01) |
| ***C22C 38/04*** | (2006.01) |
| ***C22C 38/46*** | (2006.01) |
| ***B32B 15/18*** | (2006.01) |
| ***C21D 1/74*** | (2006.01) |
| ***C21D 9/52*** | (2006.01) |
| ***C23C 2/28*** | (2006.01) |
| ***C23C 2/40*** | (2006.01) |

(52) U.S. Cl.

CPC ............ *B32B 15/043* (2013.01); *B32B 15/18* (2013.01); *C21D 1/74* (2013.01); *C21D 6/002* (2013.01); *C21D 6/005* (2013.01); *C21D 6/008* (2013.01); *C21D 8/0205* (2013.01); *C21D 8/0221* (2013.01); *C21D 8/0226* (2013.01); *C21D 8/0236* (2013.01); *C21D 8/0263* (2013.01); *C21D 8/0278* (2013.01); *C21D 9/46* (2013.01); *C21D 9/52* (2013.01); *C22C 38/002* (2013.01); *C22C 38/02* (2013.01); *C22C 38/04* (2013.01); *C22C 38/06* (2013.01); *C22C 38/12* (2013.01); *C22C 38/14* (2013.01); *C22C 38/18* (2013.01); *C22C 38/24* (2013.01); *C22C 38/26* (2013.01); *C22C 38/28* (2013.01); *C22C 38/34* (2013.01); *C22C 38/44* (2013.01); *C22C 38/46* (2013.01); *C22C 38/48* (2013.01); *C22C 38/50* (2013.01); *C22C 38/58* (2013.01); *C23C 2/02* (2013.01); *C23C 2/04* (2013.01); *C23C 2/06* (2013.01); *C23C 2/12* (2013.01); *C23C 2/26* (2013.01); *C23C 2/28* (2013.01); *C23C 2/40* (2013.01); *C23C 14/02* (2013.01); *C23C 14/14* (2013.01); *C23C 14/16* (2013.01); *C23C 14/24* (2013.01); *C23C 14/58* (2013.01); *C23C 14/5806* (2013.01); *C23C 28/021* (2013.01); *C23C 28/023* (2013.01); *C23C 28/025* (2013.01); *C23C 28/322* (2013.01); *C23C 28/3225* (2013.01); *C23C 30/00* (2013.01); *C23C 30/005* (2013.01); *C25D 3/22* (2013.01); *C25D 5/36* (2013.01); *C21D 2211/001* (2013.01); *C21D 2211/004* (2013.01); *C21D 2211/005* (2013.01); *Y10T 428/1259* (2015.01); *Y10T 428/1266* (2015.01); *Y10T 428/12611* (2015.01); *Y10T 428/12618* (2015.01); *Y10T 428/12667* (2015.01); *Y10T 428/12757* (2015.01); *Y10T 428/12799* (2015.01); *Y10T 428/12951* (2015.01); *Y10T 428/12958* (2015.01); *Y10T 428/12965* (2015.01); *Y10T 428/12972* (2015.01); *Y10T 428/12979* (2015.01); *Y10T 428/2495* (2015.01); *Y10T 428/24967* (2015.01); *Y10T 428/263* (2015.01); *Y10T 428/264* (2015.01); *Y10T 428/265* (2015.01)

(58) Field of Classification Search

CPC ........ C21D 2211/001; C21D 2211/004; C21D 2211/005; C21D 9/46; C21D 8/0268; C21D 8/0221; C21D 8/0205; C21D 6/008; C21D 6/005; C21D 6/002; C21D 3/22; C21D 8/0263; C22C 38/38; C22C 38/28; C22C 38/26; C22C 38/24; C22C 38/06; C22C 38/02; C22C 38/002; C22C 38/04; C22C 38/12; C22C 38/14; C22C 38/18; C22C 38/34; C22C 38/44; C22C 38/46; C22C 38/48; C22C 38/50; C22C 38/58; B32B 15/043; B32B 15/04; B32B 15/18; B32B 15/013; C23C 2/06; C23C 2/02; C23C 2/28; C23C 2/40; C23C 14/02; C23C 14/14; C23C 14/24; C23C 30/00; C23C 30/005; C23C 28/021; C23C 28/023; C23C 28/025; C23C 28/322; C23C 28/3225; C23C 2/04; C23C 2/26; C23C 2/12; C23C 14/16; C23C 14/58; C23C 14/5806; C25D 5/36; C25D 3/22; B22D 11/001; Y10T 428/12799; Y10T 428/12958; Y10T 428/12757; Y10T 428/12965; Y10T 428/12951; Y10T 428/12972; Y10T 428/12979; Y10T 428/1266; Y10T 428/12667; Y10T 428/12611; Y10T 428/12618; Y10T 428/1259; Y10T 428/24967; Y10T 428/2495; Y10T 428/263; Y10T 428/264; Y10T 428/265

See application file for complete search history.

(56) References Cited

U.S. PATENT DOCUMENTS

| | | | | |
|---|---|---|---|---|
| 8,636,854 | B2 | 1/2014 | Leuschner et al. | |
| 8,951,366 | B2 | 2/2015 | Sano et al. | |
| 9,109,275 | B2 | 8/2015 | Morimoto et al. | |
| 9,452,792 | B2 | 9/2016 | Takagi et al. | |
| 9,752,221 | B2 | 9/2017 | Fujita et al. | |
| 9,758,848 | B2 | 9/2017 | Kawasaki et al. | |
| 2006/0140814 | A1 | 6/2006 | Antonissen et al. | |
| 2008/0257456 | A1 | 10/2008 | Guelton et al. | |
| 2009/0053556 | A1* | 2/2009 | Sohn, II .................... | C23C 2/06 428/659 |
| 2011/0318218 | A1 | 12/2011 | Takada et al. | |
| 2013/0081740 | A1 | 4/2013 | Liu | |

(56) References Cited

U.S. PATENT DOCUMENTS

| | | | | |
|---|---|---|---|---|
| 2013/0177780 | A1 | 7/2013 | Park et al. | |
| 2014/0050941 | A1 * | 2/2014 | Kawasaki ................ | C21D 9/46 428/653 |
| 2014/0234656 | A1 * | 8/2014 | Fujita ........................ | C23C 2/02 428/659 |

FOREIGN PATENT DOCUMENTS

| | | | |
|---|---|---|---|
| CN | 102260842 | A | 11/2011 |
| CN | 102712980 | A | 10/2012 |
| CN | 103160654 | A | 6/2013 |
| EP | 1612288 | A1 | 1/2006 |
| EP | 1999287 | A1 | 12/2008 |
| EP | 2009129 | A1 | 12/2008 |
| EP | 2128293 | A1 | 12/2009 |
| EP | 2383353 | A2 | 11/2011 |
| EP | 2518181 | A1 | 10/2012 |
| JP | S55145122 | A | 11/1980 |
| JP | 2001279412 | A | 10/2001 |
| JP | 2005514518 | A | 5/2005 |
| JP | 2006045615 | A | 2/2006 |
| JP | 2012237054 | A | 12/2012 |
| JP | 2012251239 | A | 12/2012 |
| KR | 20120075260 | A | 7/2012 |
| RU | 2328545 | C2 | 7/2008 |
| RU | 2416671 | C2 | 4/2011 |
| WO | 2009142362 | A1 | 11/2009 |
| WO | 2011025042 | A1 | 3/2011 |
| WO | 2012147898 | A1 | 11/2012 |
| WO | 2013047804 | A1 | 4/2013 |

* cited by examiner

COLD ROLLED STEEL SHEET AND VEHICLE

The invention deals with cold rolled steel sheets presenting at the same time, high mechanical properties, a good formability and a good ability to receive a coating.

In particular, said steel sheets require a tensile strength TS above or equal to 1000−50×Al MPa, a uniform elongation UEl above or equal to 15%, a hole-expansion HE above or equal to 20% and a reactive surface allowing wetting and coating adhesion.

Moreover, some embodiments of said steel sheets containing high amounts of silicon or aluminium can have a low density and be more than 10% lighter compared to so-called Advanced High Strength Steels like Dual Phase, multiphase, bainitic or TRIP (Transformation Induced Plasticity) concepts.

BACKGROUND

In the automotive industry in particular, there is a continuous need to lighten vehicles while increasing safety. Thus, several families of steels like the ones mentioned above offering various strength and formability levels have been proposed.

Firstly, steels have been proposed that have micro-alloy elements which hardening is obtained simultaneously by precipitation and by refinement of the grain size. The development of such steels has been followed by the above-mentioned Advanced High Strength Steels.

For the purpose of obtaining even higher tensile strength levels, steels exhibiting TRIP behaviour with highly advantageous combinations of properties (tensile strength/formability) have been developed. These properties are associated with the structure of such steels, which consists of a ferritic matrix containing bainite and residual austenite. The residual austenite is stabilized by an addition of silicon or aluminium, these elements retarding the precipitation of carbides in the austenite and in the bainite. The presence of residual austenite gives an un-deformed sheet high ductility.

To achieve an even higher tensile strength, that is to say a level greater than 800-1000 MPa, multiphase steels having a predominantly bainitic structure have been developed. However, the formability and hole expansion properties are insufficient for next generation of automotive parts.

International application WO2009/142362 discloses a cold rolled steel sheet and a hot dip galvanized steel sheet, which has improvement in delayed fracture resistance, a tensile strength of 980 MPa or more and an elongation of 28% or more by adding a suitable amount of Al for raising the stability of retained austenite and resistance against delayed fracture into an optimum composition that can increase the amount of retained austenite. In one or more aspects of this prior art, there are provided a high strength cold rolled steel sheet and a galvanized steel sheet, each of which consists of 0.05 to 0.3 weight percent C, 0.3 to 1.6 weight percent Si, 4.0 to 7.0 weight percent Mn, 0.5 to 2.0 weight percent Al, 0.01 to 0.1 weight percent Cr, 0.02 to 0.1 weight percent Ni and 0.005 to 0.03 weight percent Ti, 5 to 30 ppm B, 0.01 to 0.03 weight percent Sb, 0.008 weight percent or less S, balance Fe and impurities. However such steels are difficult to coat due to high content of alloying elements.

International application WO2012/147898 aims at providing a high-strength steel having excellent hole expansion as well as stability of material properties, and a method for manufacturing the same, the high-strength steel plate having a TS of at least 780 MPa and a TS×EL of at least 22,000 MPa % in a low-C steel composition. The high-strength steel has good formability and stability of material properties has an ingredient composition including, in terms of mass %, 0.03%-0.25% C, 0.4%-2.5% Si, 3.5%-10.0% Mn, 0.1% or less P, 0.01% or less S, 0.01%-2.5% Al, 0.008% or less N, and Si+Al at least 1.0%, the remainder being Fe and unavoidable impurities, the steel structure having, by area ratio, 30%-80% ferrite, 0%-17% martensite, and, by volume ratio, 8% or more of residual austenite, and the average crystalline particle diameter of the residual austenite being 2 μm or less. However such steels are difficult to coat due to high content of alloying elements.

Eventually, application EP2383353 discloses a steel with an elongation at break A80 of minimum 4% and a tensile strength of 900-1500 MPa. It comprises iron and unavoidable impurities and carbon (up to 0.5%), manganese (4-12%), silicon (up to 1%), aluminum (up to 3%), chromium (0.1-4%), copper (up to 2%), nickel (up to 2%), nitrogen (up to 0.05%), phosphorus (up to 0.05%), and sulfur (up to 0.01%), and optionally at most 0.5% of one or more elements comprising vanadium, niobium or titanium. The flat rolled steel product made of the steel, comprises 30-100% of martensite, tempered martensite or bainite and residual quantity of austenite. However, such steel will present low ductility levels leading to poor formability of the steel sheet obtained.

SUMMARY OF THE INVENTION

It is an object of the present invention to provide a cold rolled steel sheet presenting simultaneously:

a tensile strength TS above or equal to 1000−50×Al MPa,
a uniform elongation UEl above or equal to 15%,
a hole-expansion HE above or equal to 20%, and
a reactive surface allowing wetting and coating adhesion.

The present invention provides a cold rolled steel sheet comprising, by weight percent:

$0.1 \le C \le 0.5\%$
$3.5 \le Mn \le 10.0\%$
$Al \le 9.0\%$
$Si \le 5.0\%$
$0.5 \le Si+Al \le 9.0\%$
$Ti \le 0.2\%$
$V \le 0.2\%$
$Nb \le 0.2\%$
$B \le 0.0035$
$Cr \le 1\%$
$S \le 0.004\%$
$P \le 0.025\%$ the remainder of the composition being iron and unavoidable impurities resulting from the smelting and the microstructure contains 10% to 50% of austenite, 25% to 90% of ferrite, less than 5% of Kappa precipitates and less than 25% of martensite, said sheet presenting from top surface the successive following layers:

a top layer of pure metallic iron which thickness ranges from 50 to 300 nm and
a first under-layer made of metallic iron which contains also one or more precipitates of oxides chosen among Mn, Si, Al, Cr and B, which thickness ranges from 1 to 8 μm.

The invention can also cover further additional characteristics, taken alone or in combination:

a cold rolled steel sheet according to the invention further comprising a second under-layer, lying under the first under-layer, made of ferrite, which thickness ranges from 10 to 50 μm, In a preferred embodiment, the invention includes a cold rolled steel sheet which composition has:

a cold rolled steel sheet which composition has a manganese content of 5.0 to 9.0%, a cold rolled steel sheet which composition has a carbon content of 0.1 to 0.3%, a range of 0.15 to 0.25% being further preferred, a cold rolled steel sheet which composition has an aluminium content of 1.5 to 9%, a range of 5 to 8% being further preferred, a cold rolled steel sheet which composition has a silicon content equal or under 1.5%, a silicon content equal or under 0.3% being further preferred, In another preferred embodiment, the steel according to the invention includes:

a cold rolled steel sheet which microstructure contains between 15 and 40% of austenite, a range between 20 and 40% of austenite being further preferred and a range of 25 and 40% of austenite being most preferred.

a cold rolled steel sheet which microstructure contains between 50 and 85% of ferrite, a cold rolled steel sheet which microstructure contains less than 15% of martensite, such martensite being possibly tempered, a cold rolled steel sheet which microstructure contains no kappa precipitates, Preferably, the cold rolled steel sheet according to the invention includes a tensile strength TS above or equal to 1000−50×% Al in MPa, a uniform elongation UEl above or equal to 15% and a hole expansion HE above or equal to 20%.

Another object of the invention is a metallic coated steel sheet obtained by coating a cold rolled steel sheet according to the invention, such coating being done by a process chosen among hot dip coating, electrodeposition and vacuum coating, possibly followed by a heat-treatment. In a preferred embodiment, such metallic coated steel sheet is galvannealed.

The cold rolled and possibly coated steel sheet according to the invention can be manufactured by any adequate method. It is preferred that such method be compatible with usual continuous annealing lines and has a low sensitivity to variation of process parameters.

Another object of the invention is a process to produce a cold rolled steel sheet comprising the following steps:

feeding and de-scaling a hot rolled strip or a thin slab which composition is according to the invention, the hot rolled strip or thin slab is then cold rolled with a cold rolling ratio between 30% and 75% so as to obtain a cold rolled steel sheet, the steel sheet then undergoes a heating, at a heating rate $H_{rate}$ at least equal to 1° C./s, up to the annealing temperature $T_{anneal}$ lying between $T_{min}$=721−36*C−20*Mn+37*Al+2*Si (in ° C.) and $T_{max}$=690+145*C−6.7*Mn+46*Al+9*Si (in ° C.) during 30 and 700 seconds followed by a soaking at said temperature, the heating from 550° C. up to $T_{anneal}$ and at least first part of the soaking taking place in an oxidizing atmosphere so as to produce an iron oxide top layer with a thickness between 100 and 600 nm, said iron oxide layer being then fully reduced, such reduction takes places during the second part of the soaking, in a reducing atmosphere containing between 2% and 35% of H2 and having a dew point under −10° C., so as to fully reduce said iron oxide layer, the steel sheet being further cooled at a cooling rate $V_{cooling2}$ above 5° C./s and below 70° C./s down to room temperature, optionally, the second part of the soaking takes place in an atmosphere which dew point is under −30° C.

In another embodiment, the steel sheet is cooled down at $V_{cooling2}$ to a temperature $T_{OA}$ between 350° C. and 550° C. and kept at $T_{OA}$ for a time between 10 and 300 seconds and then the steel sheet is further cooled at a cooling rate $V_{cooling3}$ of 5° C./s to 70° C./s down to room temperature.

In another embodiment the reduction can also take places after cooling of said steel sheet at a cooling rate $V_{cooling2}$ above 5° C./s and below 70° C./s down to room temperature, it is then done by chemical pickling.

Ideally, the coating is done by a process chosen among hot dip coating, electro-deposition and vacuum coating, possibly followed by a heat-treatment.

Preferably, the metallic coating is done by galvannealing heat treatment.

There exists different ways to obtain the hot rolled strip, one of them is a process comprising the following steps:

casting steel which composition is according to the invention so as to obtain a slab, reheating the slab at a temperature $T_{reheat}$ between 1100° C. and 1300° C., hot rolling the reheated slab at a temperature between 800° C. and 1250° C. to obtain a hot rolled steel strip, cooling the hot rolled steel strip at a cooling speed $V_{cooling1}$ of at least 10° C./s until the coiling temperature $T_{coiling}$ lower or equal to 700° C., coiling the hot rolled strip cooled at $T_{coiling}$.

In another embodiment, the hot rolled strip is obtained by a process called compact strip processing known per se and leading to a thin slab, avoiding therefore the hot rolling step.

In another embodiment, the hot rolled strip is further annealed using a process chosen among batch annealing between 400° C. and 600° C. between 1 and 24 hours and continuous annealing between 650° C. and 750° C. between 60 and 180 s.

In a preferred embodiment, using direct fire furnace for heating, the atmosphere for iron reduction contains between 20 and 35% $H_2$, the balance being nitrogen and unavoidable impurities.

In a preferred embodiment, using radiant tubes furnace for heating, the atmosphere for iron reduction contains between 2 and 8% $H_2$, the balance being nitrogen and unavoidable impurities.

Optionally, the cold rolled and annealed steel is tempered at a temperature $T_{temper}$ between 200 and 400° C. for a time $t_{temper}$ between 200 and 800 s.

In another embodiment, the cold rolled and annealed steel undergoes a phosphate conversion treatment.

In another embodiment, the steel that did not go through a reductive atmosphere during annealing is then pickled at the exit of the continuous annealing line using typical pickling baths such as formic acid, hydrochloric acid, sulphuric acid or others to erase the present surface oxides resulting in a mainly metallic surface.

The invention also provides a vehicle comprising a structural part made out of a steel sheet according to the invention.

Other features and advantages of the invention will appear through the following paragraphs of the detailed description.

BRIEF DESCRIPTION OF THE DRAWINGS

The accompanying figures are examples and shall not be taken as limiting the scope of the present invention.

The figures are such that.

DETAILED DESCRIPTION

According to the invention, the chemical composition of the steel is balanced to reach the properties targets. Following chemical composition elements are given in weight percent.

Aluminum content must be below 9.0%, as it must be kept strictly less than this value to avoid a brittle intermetallic precipitation.

Aluminum additions are interesting for many aspects so as to increase the stability of retained austenite through an increase of carbon in the retained austenite. Moreover, the inventors have shown that, surprisingly, even though Al is supposed to stabilize ferrite, in the present invention, the higher the Al content, the better the stability of the austenite formed during annealing.

The improved robustness during annealing addition of Al leads to lower variation of austenite fraction as a function of temperature during annealing on continuous annealing lines.

Al is the most efficient element, able to open a large feasibility window for continuous annealing since it favours the combination of full recrystallization at annealing temperatures $T_{anneal}$ above the non-recrystallization temperature as well as austenite stabilization.

Figure 9:
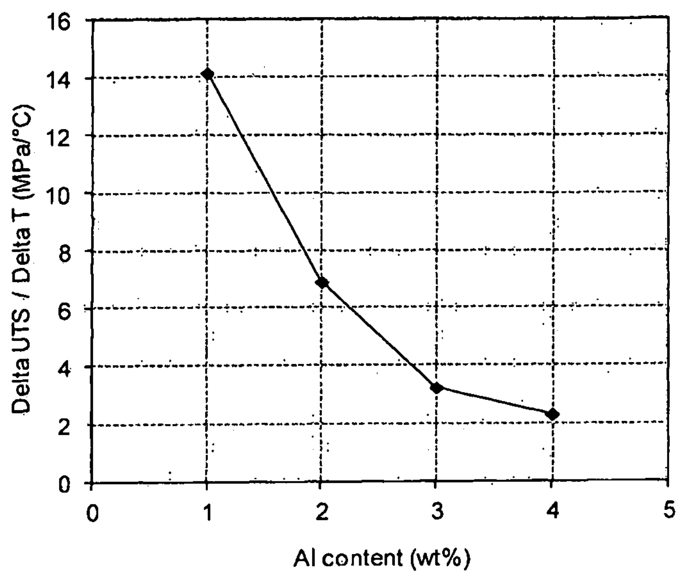
FIG. 9 shows the Al impact on the stability of tensile strength for steel D (0.2 C 5 Mn).

Al also allows reducing the steel density up to 10%. Moreover, such element reduces detrimental effects of high strength steels, such as spring-back, hydrogen embrittlement and rigidity loss. As shown in FIG. 9, above 1.5% of Al, the steel robustness is improved and delta tensile strength is equal or below 10 MPa/° C. of annealing temperature. It has however an impact of the tensile strength that can be reached. It decreases the tensile strength by 50 MPa by percent of added aluminium.

Just as aluminum, silicon is an element for reducing the density of steel. Silicon is also very efficient to increase the strength through solid solution. However its content is limited to 5.0%, because beyond this value, brittleness issues are met during cold-rolling.

According to the invention, the carbon content is between 0.10 and 0.50%. Carbon is a gamma-former element. It promotes, with the Mn, the onset of austenite. Below 0.10%, the mechanical strength above 1000−50×Al in MPa is difficult to achieve. If the carbon content is greater than 0.50%, the cold-rollability is reduced and the weldability becomes poor.

Manganese must be between 3.5% and 10.0%. This element, also austenite-stabilizer, is used to stabilize enough austenite in the microstructure. It also has a solid solution hardening and a refining effect on the microstructure. For Mn content less than 3.5%, the stabilization of the retained austenite in the microstructure is not sufficient to enable the combination of the uniform elongation above 15% and the tensile strength above 1000−50×% Al in MPa. Above 10.0%, weldability becomes poor. Segregations and inclusions deteriorate the damage properties.

Micro-alloy elements such as titanium, vanadium and niobium may be added respectively in an amount less than 0.2%, in order to obtain an additional precipitation hardening. In particular titanium and niobium are used to control the grain size during the solidification. One limitation, however, is necessary because beyond, a saturation effect is obtained.

Chromium is tolerated up to 1%. Above that limit, detrimental surface oxides may appear.

Above a sulphur content of 0.004%, the ductility is reduced due to the presence of excess sulfides such as MnS which reduce the ductility, in particular during hole-expansion tests.

Phosphorus is an element which hardens in solid solution but which reduces the spot weldability and the hot ductility, particularly due to its tendency to segregation at the grain boundaries or co-segregation with manganese. For these reasons, its content must be limited to 0.025%, and preferably 0.015%, in order to obtain good spot weldability.

The maximum boron content allowed by the invention is 0.0035%. Above such limit, a saturation level is expected as regard to grain refinement.

The balance is made of iron and inevitable impurities.

To reach the targeted properties, the microstructure of the steel sheet of the invention must contain, as surface fraction, 10% to 50% of austenite, 25% to 90% of ferrite, kappa precipitates below 5% and martensite lower than 25%.

Austenite is a structure that brings ductility, its content must be above 10% so that the steel of the invention is enough ductile with uniform elongation above 15% and its content must be below 50% because above that value the mechanical properties balance deteriorates.

Ferrite in the invention is defined by a cubic center structure obtained from recovery and recrystallization upon annealing whether from preceding ferrite formed during solidification or from bainite or martensite of the hot rolled steel. Its content must be between 25 and 90% so as to have (1000−50×% Al) in MPa minimum of tensile strength and at least 15% of uniform elongation.

Kappa in the invention is defined by precipitates whose stoechiometry is $(Fe,Mn)_3AlC_x$, where x is strictly lower than 1. The surface density of precipitates Kappa can go up to 5%. Above 5%, the ductility decreases and uniform elongation above 15% is not achieved. In addition, uncontrolled precipitation Kappa around the ferrite grain boundaries may occur, increasing, as a consequence, the efforts during hot and/or cold rolling. Preferentially, the surface density of Kappa precipitates should be less than 2%. As the microstructure is uniform, the surface fraction is equal to the volume fraction.

Martensite is a structure formed during cooling after the soaking from the unstable austenite. Its content must be limited to 25% so that the hole expansion remains above 20%. In a preferred embodiment, such martensite is tempered, either after or before the coating step, depending on the type of coating.

Another main characteristic of the steel sheet according to the invention lies in its reactive surface, which can be described as comprising the successive following layers:

a top layer of pure metallic iron which thickness ranges from 50 to 300 nm and a first under-layer made of metallic iron which contains also one or more precipitates of oxides chosen among Mn, Si, Al, Cr and B, which thickness ranges from 1 to 8 μm.

Such a structure guarantees reactivity during the phosphate conversion treatment of the bare steel, a good wetting and adherence of metallic coatings such as zinc or aluminium coatings. This improves the ability for electro-deposition of paint.

As long as such surface is obtained, any suitable manufacturing method can be employed.

By example, one method to produce the steel according to the invention implies casting steel with the chemical composition of the invention.

The cast steel is reheated between 1100° C. and 1300° C. When slab reheating temperature is below 1100° C., for Al<4 wt %, the rolling loads increase too much and hot rolling process becomes difficult; for Al≥4 wt %, the last hot rolling pass is hardly kept above 800° C. due to thermal losses during the rolling process. Above 1300° C., oxidation is very intense, which leads to scale loss and surface degradation.

The reheated slab can then be hot rolled with a temperature between 1250° C. and 800° C., the last hot rolling pass taking place at a temperature $T_{lp}$ above or equal to 800° C. If $T_{lp}$ is below 800° C., hot workability is reduced.

The steel is cooled at a cooling speed $V_{cooling1}$ of at least 10° C./s until the coiling temperature $T_{coiling}$ lower or equal to 700° C. If the cooling speed $V_{cooling1}$ is below 10° C./s, in the case where Al≥4 wt %, and Mn≥4 wt %, there is a precipitation of harmful Kappa precipitates at the interfaces between ferrite and austenite.

$T_{coiling}$ must be lower or equal to 700° C., If the coiling temperature is above 700° C., there is a risk to form a coarse microstructure consisting of:

- coarse ferrite and bainite structure when Al content is below 4 wt %; and
- Kappa carbides at the interfaces between ferrite and austenite when Al content is above or equal to 4 wt % Al and Mn above 4% Mn.

The steel is then cold rolled with a cold rolling ratio between 30% and 75% so as to obtain a cold rolled steel. Below 30%, the recrystallization during subsequent annealing is not favoured enough and the uniform elongation above 15% is not achieved due to a lack of recrystallization. Above 75%, there is a risk of edge cracking during cold-rolling.

Then, the steel is heated at a heating rate $H_{rate}$ at least equal to 1° C./s up to the annealing temperature $T_{anneal}$. If the heating rate is below 1° C./s, the force for recrystallization is too low, hindering the achievement of the target microstructure.

During the heating, from 550° C. up to the end of soaking at $T_{anneal}$, the steel goes through an oxidizing atmosphere so as to produce predominantly an iron oxide with a thickness between 100 and 600 nm.

- If the iron oxide is thinner than 100 nm, the iron oxide will disappear too early, allowing again external selective oxidation of the alloying elements during the subsequent reductive annealing, hindering reactivity of the surface during the coating process,
- If the iron oxide is above 600 nm, the risk of non-adherent iron oxides is given polluting the hearth roll of the furnace by pick-up issues and leading thus by indentation to surface defects. A thickness greater than 600 nm can also lead to an only partial reduction of the iron oxide during the soaking or cooling, or soaking and cooling step when a reductive atmosphere is applied.

If radiant tubes are used in the furnace for heating, the atmosphere for iron reduction shall contain between 2 and 8% $H_z$, the balance being nitrogen and unavoidable impurities:

- If the $H_2$ content is lower than 2%, reduction ability of the atmosphere is too low to reduce completely the iron oxide.
- If the $H_2$ content is higher than 8%, the reduction process is complete, but no more economically viable.

The steel is then annealed at a temperature $T_{anneal}$ between $T_{min}$° C. and $T_{max}$° C. during 30 and 700 seconds. Controlling the annealing temperature is an important feature of the process since it enables to control the austenite fraction and its chemical composition. The annealing temperature should be high enough to form more than the 10% retained austenite required in the final microstructure and to avoid precipitation of more than 5% Kappa carbides. The annealing temperature should not be too high to avoid the formation of more than 50% austenite and to avoid grain coarsening leading to a tensile strength below 1000−50×Al (%) when Al≥4 wt %. The annealing temperature should also be sufficiently high to enable the sufficient recrystallization of the cold-rolled structure. As the phase transformations depend on the chemical composition, the preferred $T_{anneal}$ is defined as the following preferably:

- The annealing temperature $T_{min}$ is defined such as: $T_{min}$=721−36*C−20*Mn+37*Al+2*Si, (in ° C.). Below this temperature, the minimum austenite fraction is not formed, or its stability is too high, leading to a limited tensile strength.
- The annealing temperature $T_{max}$ is defined such as: $T_{max}$=690+145*C−6.7*Mn+46*Al+9*Si (in ° C.). Above $T_{max}$, there is also a risk to form too many martensite, leading to a limited uniform elongation and hole expandability.

During the soaking at $T_{anneal}$ down to 600° C., the steel goes through an atmosphere containing between 2% and 35% $H_2$, the balance being nitrogen and unavoidable impurities, so as to reduce the iron oxide formed upon heating applying a dew point below the critical dew point for iron oxidation typically below −10° C.

- If the $H_2$ content is lower than 2%, reduction ability of the atmosphere is too low to reduce completely the iron oxide.
- If the $H_2$ content is higher than 35%, the reduction process is complete, but no more economically viable.

Preferably, the dew point during iron reduction is below −30° C., so as to allow fast reduction kinetics.

In a preferred embodiment, $H_2$ content is higher than 20% but lower than 35%.

In another embodiment, the reduction step is by-passed and the iron oxide is removed by pickling (formic acid, chlorohydric acid, sulphuric acid) after the whole annealing treatment is completed. This is because, if the steel does no go through a reductive atmosphere, slight re-oxidation may take place and this layer shall be removed. In the invention:

- First part of the soaking means the heating and up to 90% of the soaking time
- While the second part of the soaking means the remaining soaking time and the cooling from the annealing temperature down to 600° C.

The steel is then cooled at a cooling rate $V_{cooling2}$ of typical annealing lines, preferably, this cooling rate is above 5° C./s and below 70° C./s. If the cooling rate is below 5° C./s, there is a risk to form more than 5% of Kappa carbides when Al content is above 4 wt %. The cooling atmosphere contains between 2% and 35% H2 so as to avoid re-oxidation of the reduced iron oxide formed applying a dew point below the critical dew point for iron oxidation typically below −10° C.

Optionally, the steel is cooled down at $V_{cooling2}$ to a temperature $T_{OA}$ between 350° C. and 550° C. and kept at $T_{OA}$ for a time between 10 and 300 seconds. It was shown that such a thermal treatment to facilitate the Zn coating by hot dip process for instance does not affect the final mechanical properties.

The steel is further cooled at a cooling rate $V_{cooling3}$ of typical annealing lines down to room temperature, preferably, this cooling rate is above 5° C./s and below 70° C./s to obtain a cold rolled and annealed steel.

In another embodiment, after maintaining the steel at $T_{OA}$, the steel is hot dip coated with Zn or Zn alloys meaning that Zn content is the highest in the alloy in percent.

In another embodiment, after maintaining the steel at $T_{OA}$, the steel is hot dip coated with Al or Al alloys meaning that Al content is the highest in the alloy in percent.

Optionally, the cold rolled and annealed steel is tempered at a temperature $T_{temper}$ between 200 and 400° C. for a time $t_{temper}$ between 200 and 800 seconds. This treatment enables the tempering of martensite, which might be formed during cooling after the soaking from the unstable austenite. The martensite hardness is thus decreased and the hole expandability is improved. Below 200° C., the tempering treatment is not efficient enough. Above 400° C., the strength loss becomes high and the balance between strength and hole expansion is not improved anymore.

In another embodiment, the cold rolled and annealed steel undergoes a phosphate conversion treatment.

In another embodiment, the cold rolled and annealed steel is coated by Zn, Zn-alloys, Al or Al alloys applied by electrodeposition or vacuum technologies. Zn alloys and Al alloys meaning that respectively, Zn and Al are major constituents of the coating.

Semi-finished products have been developed from a steel casting. The chemical compositions of semi-finished products, expressed in weight percent, are shown in Table 1 below. The rest of the steel composition in Table 1 includes or consists of iron and inevitable impurities resulting from the smelting.

TABLE 1

Chemical composition (wt %).

| Steel | C | Mn | Al | Si | Cr | Si + Al | Comment |
|---|---|---|---|---|---|---|---|
| A | 0.21 | 8.2 | 7.4 | 0.26 | 0.02 | 7.66 | Invention |
| B | 0.2 | 3.8 | 0 | 1.5 | 0.3 | 1.5 | Invention |
| C | 0.15 | 1.9 | 0.05 | 0.2 | 0.2 | 0.25 | Comparative example |
| D | 0.196 | 5.01 | 1.03 | 0.012 | <0.010 | 1.042 | Invention |
| E | 0.189 | 5.01 | 2.85 | 0.02 | <0.010 | 2.87 | Invention |
| F | 0.2 | 4 | 6.2 | <0.050 | <0.010 | 6.2 | Invention |
| G | 0.19 | 6.2 | 6 | <0.050 | <0.010 | 6 | Invention |
| H | 0.12 | 5.15 | 2.31 | 0.509 | <0.010 | 2.819 | Invention |

| Steel | S | P | Ti | V | Nb | Comment |
|---|---|---|---|---|---|---|
| A | <0.005 | <0.025 | <0.010 | <0.010 | <0.010 | Invention |
| B | <0.005 | <0.025 | <0.010 | <0.010 | <0.010 | Invention |
| C | <0.005 | <0.025 | <0.01 | <0.01 | <0.01 | Comparative example |
| D | 0.002 | 0.022 | <0.010 | <0.010 | <0.010 | Invention |
| E | 0.0021 | 0.02 | <0.010 | <0.010 | <0.010 | Invention |
| F | 0.0031 | 0.02 | <0.010 | <0.010 | <0.010 | Invention |
| G | 0.004 | 0.017 | <0.010 | <0.010 | <0.010 | Invention |
| H | <0.005 | 0.017 | <0.010 | <0.010 | <0.010 | Invention |

These steels are boron free.

The products have first been hot-rolled. The hot rolled plates were then cold rolled and annealed. The production conditions are shown in Table 2 with the following abbreviations:

$T_{reheat}$: is the reheating temperature;

$T_{lp}$ is the finishing rolling temperature;

$V_{cooling1}$: is the cooling rate after the last rolling pass;

$T_{coiling}$: is the coiling temperature;

Rate: is the rate of cold rolling reduction;

$H_{rate}$: is the heating rate;

$T_{anneal}$: is the soaking temperature during annealing;

$t_{anneal}$: is the soaking duration during annealing;

$V_{cooling2}$: is the cooling rate after the soaking;

$t_{OA}$: is the time during which the plate is maintained at a temperature $T_{OA}$;

$V_{cooling3}$: is the cooling rate below $T_{OA}$.

TABLE 2

Hot-rolling and cold-rolling and annealing conditions

| | $T_{reheat}$ (° C.) | $T_{lp}$ (° C.) | $V_{cooling1}$ (° C./s) | $T_{cooling}$ (° C.) | Rate (%) | $H_{rate}$ (° C./s) | $T_{anneal}$ (° C.) | $t_{anneal}$ (s) | $V_{cooling2}$ (° C./s) | $T_{OA}$ (° C.) | $t_{OA}$ (s) | $V_{cooling3}$ (° C./s) |
|---|---|---|---|---|---|---|---|---|---|---|---|---|
| A1 | 1180 | 905 | 50 | 500 | 74 | 15 | 830 | 136 | 50 | — | — | 50 |
| A2 | 1180 | 964 | 50 | 500 | 74 | 15 | 850 | 136 | 50 | — | — | 50 |
| A3 | 1180 | 964 | 50 | 500 | 74 | 15 | 790 | 136 | 50 | — | — | 50 |
| A4 | 1180 | 964 | 50 | 500 | 74 | 15 | 900 | 136 | 50 | — | — | 50 |
| A5 | 1180 | 964 | 50 | 500 | 74 | 15 | 850 | 136 | 50 | — | — | 50 |
| A6 | 1180 | 964 | 50 | 500 | 74 | 15 | 900 | 136 | 50 | — | — | 50 |
| A7 | 1180 | 964 | 50 | 500 | 74 | 15 | 900 | 136 | 50 | — | — | 50 |
| A8 | 1180 | 964 | 50 | 500 | 74 | 15 | 830 | 136 | 50 | — | — | 50 |
| B1 | 1250 | 900 | 30 | 550 | 50 | 5 | 790 | 130 | 20 | 470 | 38 | 20 |
| B2 | 1250 | 900 | 30 | 550 | 50 | 5 | 790 | 130 | 20 | 470 | 38 | 20 |
| B3 | 1250 | 900 | 30 | 550 | 50 | 5 | 675 | 130 | 20 | 470 | 38 | 20 |
| C1 | 1250 | 900 | 30 | 550 | 60 | 10 | 800 | 60 | 20 | 460 | 10 | 20 |
| D1 | 1250 | 930 | 15 | 600 | 50 | 16 | 710 | 120 | 20 | 400 | 300 | 5 |
| E1 | 1250 | 930 | 15 | 600 | 50 | 16 | 770 | 120 | 20 | 400 | 300 | 5 |

TABLE 2-continued

Hot-rolling and cold-rolling and annealing conditions

| | $T_{reheat}$ (° C.) | $T_{lp}$ (° C.) | $V_{cooling1}$ (° C./s) | $T_{cooling}$ (° C.) | Rate (%) | $H_{rate}$ (° C./s) | $T_{anneal}$ (° C.) | $t_{anneal}$ (s) | $V_{cooling2}$ (° C./s) | $T_{OA}$ (° C.) | $t_{OA}$ (s) | $V_{cooling3}$ (° C./s) |
|---|---|---|---|---|---|---|---|---|---|---|---|---|
| F1 | 1200 | 950 | 60 | 450 | 75 | 15 | 900 | 136 | 50 | 410 | 500 | 20 |
| F2 | 1200 | 950 | 60 | 450 | 75 | 15 | 900 | 136 | 50 | 410 | 500 | 20 |
| F3 | 1200 | 950 | 60 | 450 | 75 | 15 | 900 | 136 | 50 | 410 | 500 | 20 |
| F4 | 1200 | 950 | 60 | 450 | 75 | 15 | 900 | 136 | 50 | 410 | 500 | 20 |
| G1 | 1200 | 950 | 60 | 450 | 75 | 15 | 850 | 136 | 50 | 410 | 500 | 20 |
| G2 | 1200 | 950 | 60 | 450 | 75 | 15 | 850 | 136 | 50 | 410 | 500 | 20 |
| H1 | 1200 | 900 | 10 | 600 | 50 | 10 | 770 | 120 | 20 | 410 | 500 | 5 |

The products were annealed under different annealing atmospheres. In Table 3, the annealing atmospheres are presented, and the indication of pickling in formic acid after the complete continuous annealing cycle. "Yes" if a pickling treatment was applied, "No" if no pickling treatment was applied.

If the annealing atmosphere from 550° C. up to the end of soaking at $T_{anneal}$ was oxidizing for iron by adjusting the dew point and the hydrogen content, the indication "Oxidizing" was set in the column "Atmosphere from 550° C. up to the end of soaking at $T_{anneal}$"; If the atmosphere was reducing for iron, "Reducing" was set. Additionally, the H2 content and the dew point of the annealing atmosphere are given.

If the annealing atmosphere during the soaking at $T_{anneal}$ down to 600° C. was reducing for iron oxide, the indication "Reducing" was set in the column "Atmosphere during the soaking at $T_{anneal}$ down to 600° C.". If the annealing atmosphere was oxidizing for iron, "oxidizing" is indicated. Additionally, the H2 content and the dew point of the annealing atmosphere are given.

Figure 3:
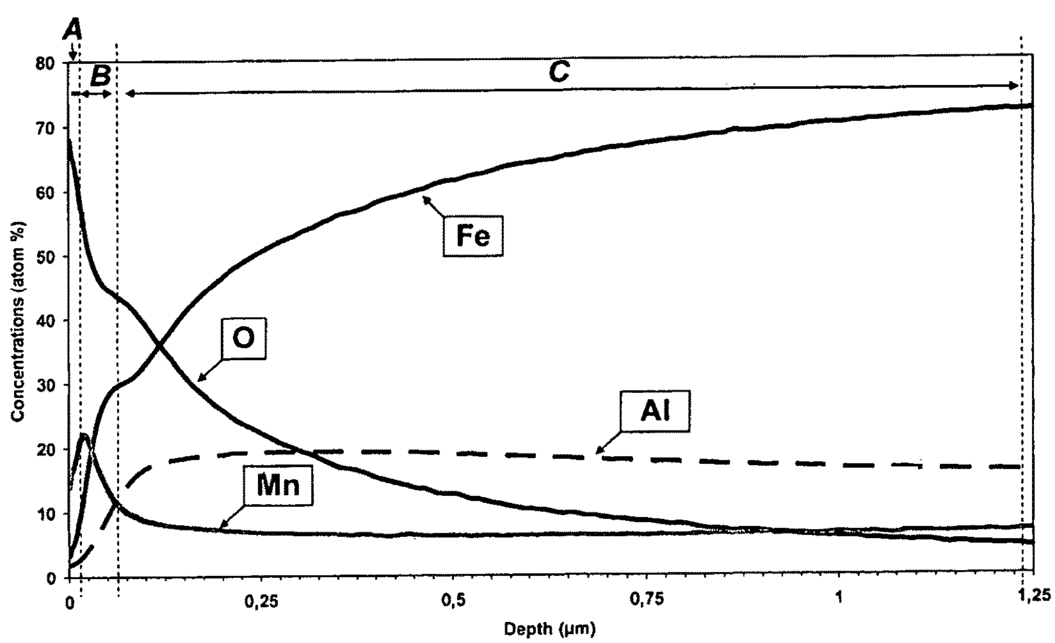
FIG. 3 shows GDOS profile of the example A6 that has been produced out of the invention.

In table 3 here below, EG stands for electro-galvanized while GI stands for galvanized.

signal is very low while the O signal is high, reaching more than 50% at the free surface. In that zone, Mn enrichment is also detected. Below that layer the Fe signal increases and the O signal decreases at a rate of about 1% per nanometer. This oxygen signal tail is typical of the presence of an external selective oxide layer, which oxygen atoms are partly sputtered and partly implanted into the substrate during the measurement. Some superficial pollution is visible due to the transfer of the samples from the annealing simulator to the GDOS analysis. At FIG. 3, In (A) some superficial pollution is visible due to the transfer of the samples from the annealing simulator to the GDOS analysis.

Table 4 presents the following characteristics:

Ferrite: "OK" refers to the presence of ferrite with a volume fraction between 25 and 90% in the microstructure of the annealed sheet. "KO" refers to comparative examples where ferrite fraction is outside this range.

Austenite: "OK" refers to the presence of austenite with a volume fraction between 10 and 50% in the microstructure of the annealed sheet. "KO" refers to comparative examples where austenite fraction is outside this range.

TABLE 3

Annealing conditions to create the proper reactive surface after annealing, balance N2

| Steel | Atmosphere from 550° C. up to the end of the first part of the soaking | Atmosphere during the second part of soaking at Tanneal down to 600° C. | Pickling in formic acid after the continuous annealing | coating type |
|---|---|---|---|---|
| A1 | Oxidizing - Dew point +30° C., 5% H2 | Reducing - Dew point −40° C., 5% H2 | No | EG |
| A2 | Oxidizing - Dew point +30° C., 5% H2 | Reducing - Dew point −40° C., 5% H2 | No | EG |
| A3 | Oxidizing - Dew point +30° C., 5% H2 | Reducing - Dew point −40° C., 5% H2 | No | EG |
| A4 | Oxidizing - Dew point +30° C., 5% H2 | Reducing - Dew point −40° C., 5% H2 | No | EG |
| A5 | Oxidizing - Dew point +30° C., 5% H2 | <u>Oxidizing</u>- Dew point +30° C., 5% H2 | No | EG |
| A6 | <u>Reducing</u>- Dew point −40° C., 5% H2 | Reducing - Dew point −40° C., 5% H2 | No | EG |
| A7 | Oxidizing - Dew point +30° C., 5% H2 | Oxidizing - Dew point +30° C., 5% H2 | Yes | EG |
| A8 | Oxidizing - Dew point +30° C., 5% H2 | Reducing - Dew point −40° C., 5% H2 | No | GI |
| B1 | Oxidizing - Dew point +30° C., 5% H2 | Reducing - Dew point −40° C., 5% H2 | No | GI |
| B2 | <u>Reducing</u>- Dew point −40° C., 5% H2 | Reducing - Dew point −40° C., 5% H2 | No | GI |
| B3 | Oxidizing - Dew point +30° C., 5% H2 | Reducing - Dew point −40° C., 5% H2 | No | GI |
| C1 | Oxidizing - Dew point +30° C., 5% H2 | Reducing - Dew point −40° C., 5% H2 | No | GI |
| D1 | Oxidizing - Dew point +30° C., 5% H2 | Reducing - Dew point −40° C., 5% H2 | No | EG |
| E1 | Oxidizing - Dew point +30° C., 5% H2 | Reducing - Dew point −40° C., 5% H2 | No | EG |
| F1 | Oxidizing - Dew point +30° C., 5% H2 | Reducing - Dew point −40° C., 5% H2 | No | EG |
| F2 | <u>Reducing</u>- Dew point −40° C., 5% H2 | Reducing - Dew point −40° C., 5% H2 | No | EG |
| F3 | Oxidizing - Dew point +30° C., 5% H2 | Reducing - Dew point −40° C., 5% H2 | No | GI |
| F4 | <u>Reducing</u>- Dew point −40° C., 5% H2 | Reducing - Dew point −40° C., 5% H2 | No | GI |
| G1 | Oxidizing - Dew point +30° C., 5% H2 | Reducing - Dew point −40° C., 5% H2 | No | EG |
| G2 | <u>Reducing</u>- Dew point −40° C., 5% H2 | Reducing - Dew point −40° C., 5% H2 | No | EG |
| H1 | Oxidizing - Dew point +30° C., 5% H2 | Reducing - Dew point −40° C., 5% H2 | No | EG |

Samples A6, B2, F2, F4 and G2 have been annealed under a regular reducing atmosphere (dew point=−40° C., 5% H2) giving rise to bad surface reactivity. The GDOS profile of such surfaces is characterized by a first zone where the Fe Martensite: "OK" refers to the presence or not of martensite with a volume fraction less than 25% in the microstructure of the annealed sheet. "KO" refers to comparative examples where martensite fraction is above 25%.

K: "OK" refers to the presence or not of precipitates in the microstructure Kappa with a surface fraction of less than 5%. This measurement is performed with a scanning electron microscope. When it says "KO", fraction of kappa precipitates is above 5%.

UTS (MPa) refers to the tensile strength measured by tensile test in the longitudinal direction relative to the rolling direction.

UEl (%) refers to the uniform elongation measured by tensile test in the longitudinal direction relative to the rolling direction.

HE (%): refers to the hole expansion ratio according to the norm ISO 16630 2009. The method of determining the hole expansion ratio HE % is used to evaluate the ability of a metal to resist to the forming of a cut-edge. It consists in measuring the initial diameter $D_i$ of the hole before forming, then the final hole diameter $D_f$ after forming, determined at the time of through-cracks observed on the edges of the hole. It then determines the ability to hole expansion HE % using the following formula:

$$HE\ \% = 100 \times \frac{(Df - Di)}{Di}$$

Under this method, the initial hole diameter is of 10 millimeters.

TABLE 4

Properties of cold-rolled and annealed sheets

| Steel | Ferrite | Austenite | martensite | K | TS (MPa) | UEI (%) | HE (%) |
|---|---|---|---|---|---|---|---|
| A1 | OK (81%) | OK (17%) | OK (0%) | OK (2%) | 831 | 15 | 30% |
| A2 | OK (80%) | OK (20%) | OK | OK (0%) | 800 | 15 | 42 |
| A3 | OK | OK (15%) | OK (0%) | KO (>5%) | Not measured | Not measured | Not measured |
| A4 | OK | OK (25%) | OK | OK (0%) | 730 | 20 | Not measured |
| A5 | OK (80%) | OK (20%) | OK | OK (0%) | 800 | 15 | 42 |
| A6 | OK | OK (25%) | OK | OK (0%) | 730 | 20 | Not measured |
| A7 | OK | OK (25%) | OK | OK (0%) | 730 | 20 | Not measured |
| A8 | OK (81%) | OK (17%) | OK (0%) | OK (2%) | 831 | 15 | 30% |
| B1 | KO | KO (8%) | KO (92%) | OK (0%) | Not measured | Not measured | Not measured |
| B2 | KO | KO (8%) | KO (92%) | OK (0%) | Not measured | Not measured | Not measured |
| B3 | OK (60%) | OK (30%) | OK (10%) | OK (0%) | 1092 | 17 | 30 |
| C1 | OK (40%) | KO (0%) | OK (10%) | OK (0%) | <u>820</u> | <u>14</u> | 23 |
| D1 | OK (50%) | OK (28%) | OK (22%) | OK (0%) | 1075 | 22.8 | Not measured |
| E1 | OK (66%) | OK (32%) | OK (2%) | OK (0%) | 1023 | 24.4 | Not measured |
| F1 | OK (79%) | OK (21%) | OK (0%) | OK (0%) | 723 | 25 | Not measured |
| G1 | OK (74%) | OK (26%) | OK (0%) | OK (0%) | 702 | 20 | Not measured |
| H1 | OK (69%) | OK (23%) | OK (8%) | OK (0%) | 965 | 16 | Not measured |

B1 has not been measured due to brittle behaviour. For C1, the rest of the microstructure (50%) is made of bainite. C1 presents a tensile strength of 820 MPa which is too low for the invention.

Table 5 presents the results of coatability by electro deposition of a Zinc coating.

The targeted surface and subsurface micro structure is indicated as "OK" if the surface is made of an external layer of metallic iron, thickness ranging from 50 to 300 nm, covering an internal layer made of metallic iron and containing precipitates of internal oxides of Mn, Al, Si, Cr and B and other elements more oxidizable than iron, which thickness ranges from 1 to 8 µm, superimposed onto a decarburized layer, mainly made of ferrite, which thickness ranges from 10 to 50 µm. If the surface and subsurface differs from the targeted surface, the microstructure is judged unsufficient "KO".

The coating quality is characterised by the covering ratio and the coating adherence.

The covering ratio is indicated as "OK", when full coverage is observed by the naked eye, and "KO" if coating defects such as uncoated areas or bare spots are observed.

The coating adherence was tested in a 3-point bending test (180°) on 1 mm sheets using a 3 mm punch with a tip of 1.5 mm in radius. The adherence is judged excellent "OK" if no peeling of the zinc coating is observed after applying and withdrawing of an adhesive "scotch" tape. If peeling or flaking of the coating is observed, the adherence is judged insufficient "KO".

TABLE 5

Surface properties of cold-rolled and annealed and coated sheets

| | Targeted surface and subsurface micro structure | Covering ratio | Coating adherence | Coating type | |
|---|---|---|---|---|---|
| A1 | OK | OK | OK | EG | Invention |
| A2 | OK | OK | OK | EG | Invention |
| A3 | OK | OK | OK | EG | Invention |
| A4 | OK | OK | OK | EG | Invention |

TABLE 5-continued

Surface properties of cold-rolled and annealed and coated sheets

| | Targeted surface and subsurface micro structure | Covering ratio | Coating adherence | Coating type | |
|---|---|---|---|---|---|
| A5 | KO | KO | KO | EG | reference |
| A6 | KO | KO | KO | EG | reference |
| A7 | OK | OK | OK | EG | Invention |
| A8 | OK | OK | OK | GI | Invention |
| B1 | OK | OK | OK | GI | Invention |
| B2 | KO | KO | KO | GI | reference |
| B3 | OK | OK | OK | GI | Invention |
| C1 | OK | OK | OK | GI | Invention |
| D1 | OK | OK | OK | EG | Invention |
| E1 | OK | OK | OK | EG | Invention |

TABLE 5-continued

Surface properties of cold-rolled and annealed and coated sheets

| | Targeted surface and subsurface micro structure | Covering ratio | Coating adherence | Coating type | |
|---|---|---|---|---|---|
| F1 | OK | OK | OK | EG | Invention |
| F2 | KO | KO | KO | EG | reference |
| F3 | OK | OK | OK | GI | Invention |
| F4 | KO | KO | KO | GI | reference |
| G1 | OK | OK | OK | EG | Invention |
| G2 | KO | KO | KO | EG | reference |
| H1 | OK | OK | OK | EG | Invention |

Figure 5:
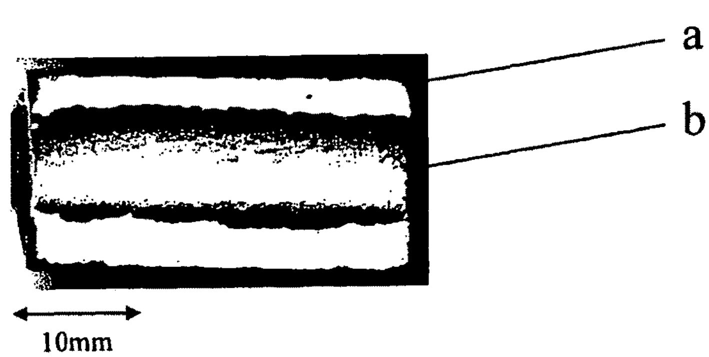
FIG. 5 shows the result of the 3-point bending test on the A6 example.

In FIG. 5, the coating adherence was tested in a 3-point bending test (180°) on 1 mm sheets using a 3 mm punch with a tip of 1.5 mm in radius. Non-adherence of zinc coating is observed for steel example A6 (out of the invention). At (a), a coated part is visible, which was under low solicitation during the bending test. At (b), the steel substrate is visible after peeling off of coating; this part was under high solicitation in the bending test.

Sheets A1, A2, A3, A4, A7, A8, B1, B3, C1, D1, E1, F1, F3, G1 and H1 are sheets whose chemical composition and processing method are according to the invention.

Figure 4:
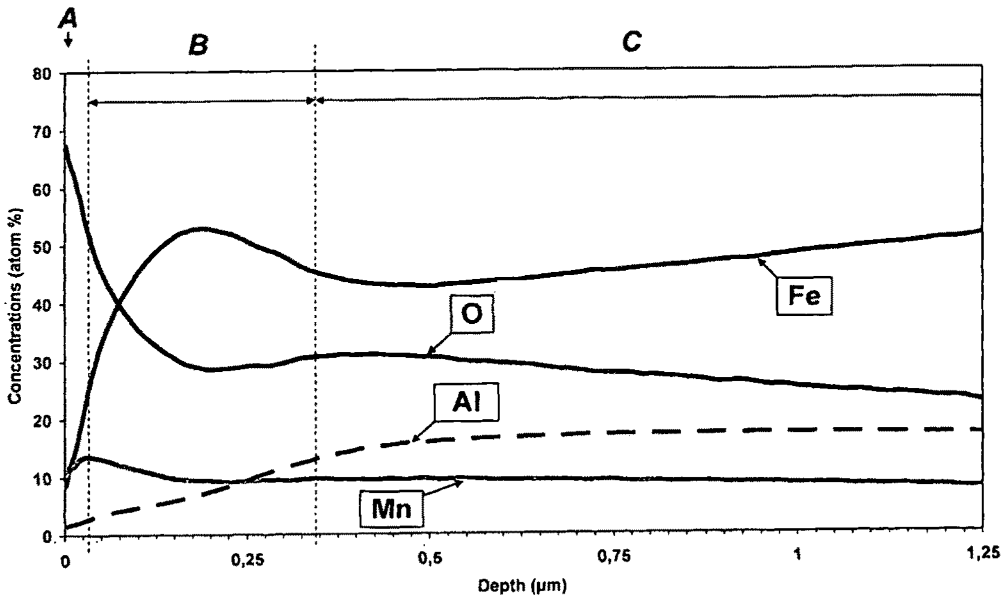
FIG. 4 shows GDOS profile of the example A3 that has been produced according to the invention.

For the sample A3, the production has been carried out under an oxidizing atmosphere (dew point=+30° C.) followed by a reducing atmosphere. The surface is made of a first layer where the Fe GDOS signal reaches a maximum and the oxygen one a minimum as shown in FIG. 4. This layer (B) is made of metallic iron. The second layer (C) is characterized by a continuous decrease of the oxygen signal at a slow rate, around 1% per 100 nm and corresponds to a zone where internal selective oxides of Mn and Al have precipitated. It extends up to an oxygen level of 5% which corresponds here to a thickness of 4 μm. In (A) some superficial pollution is visible due to the transfer of the samples from the annealing simulator to the GDOS analysis.

Figure 6:
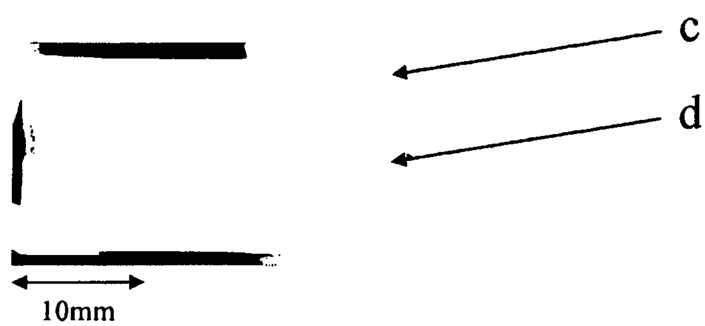
FIG. 6 shows the result of the 3-point bending test on the A3 example.

For sample A3, the coating adherence was tested in a 3-point bending test (180°) on 1 mm sheets using a 3 mm punch with a tip of 1.5 mm in radius. Very good adherence of the zinc coating is observed for steel example A3 (within the invention) as shown in FIG. 6. At (c), a coated part is visible, which was under low solicitation during the bending test. At (d), the coating is showing excellent adherence, this part was under high solicitation in the bending test.

Figure 7:
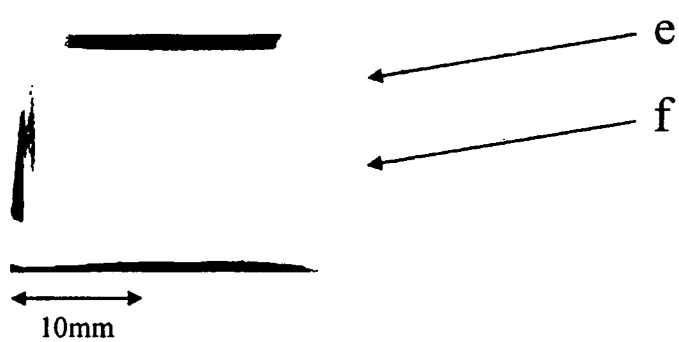
FIG. 7 shows the result of the 3-point bending test on the A4 example.
Figure 8:
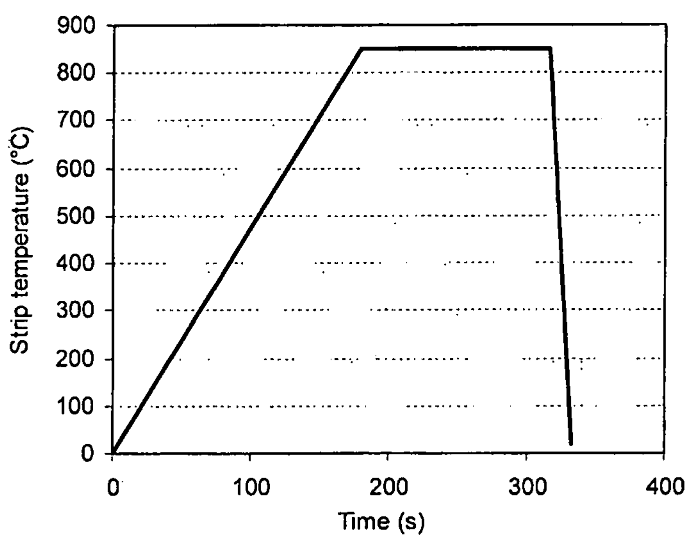
FIG. 8 shows the thermal path of the annealing cycle according to the example A2.

The coating adherence was also tested in a 3-point bending test (180°) on 1 mm sheets using a 3 mm punch with a tip of 1.5 mm in radius for A4 as shown in FIG. 7. Very good adherence of the zinc coating is observed for steel example A4 (within the invention). At (e), a coated part is visible, which was under low solicitation during the bending test. At (f), the coating is showing excellent adherence, this part was under high solicitation in the bending test.

Figure 1:
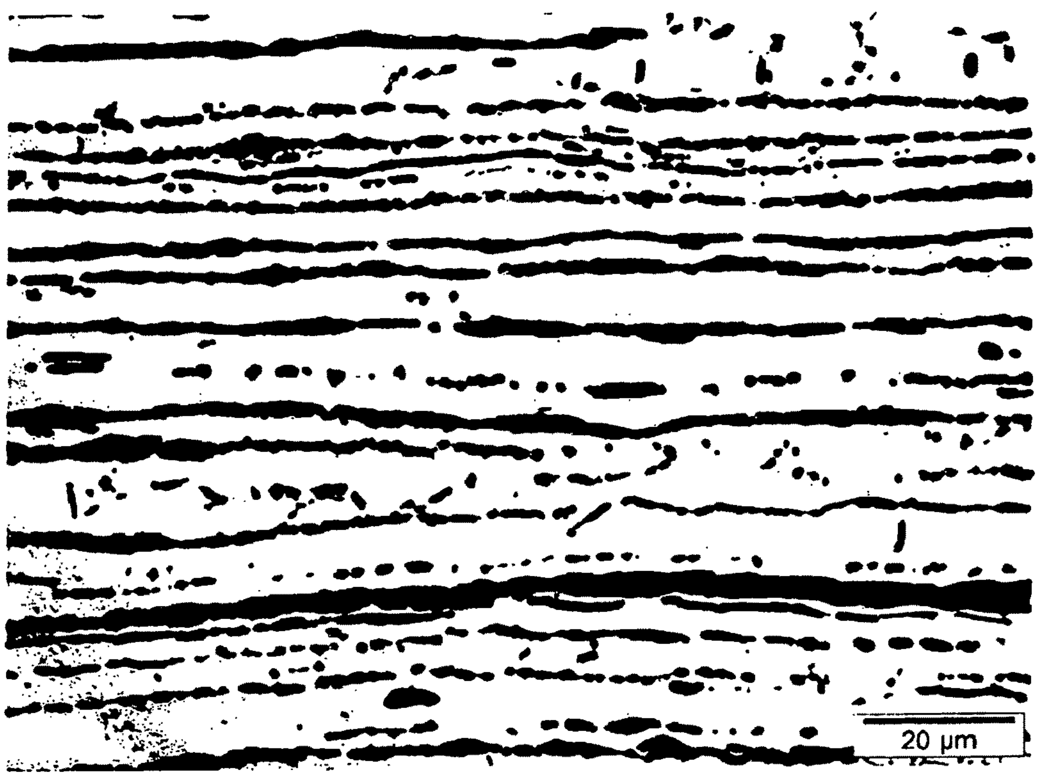
FIG. 1 illustrates the microstructure of example A2 after cold-rolling and annealing. The dark phase is the austenite, white phase is the ferrite.
Figure 2:
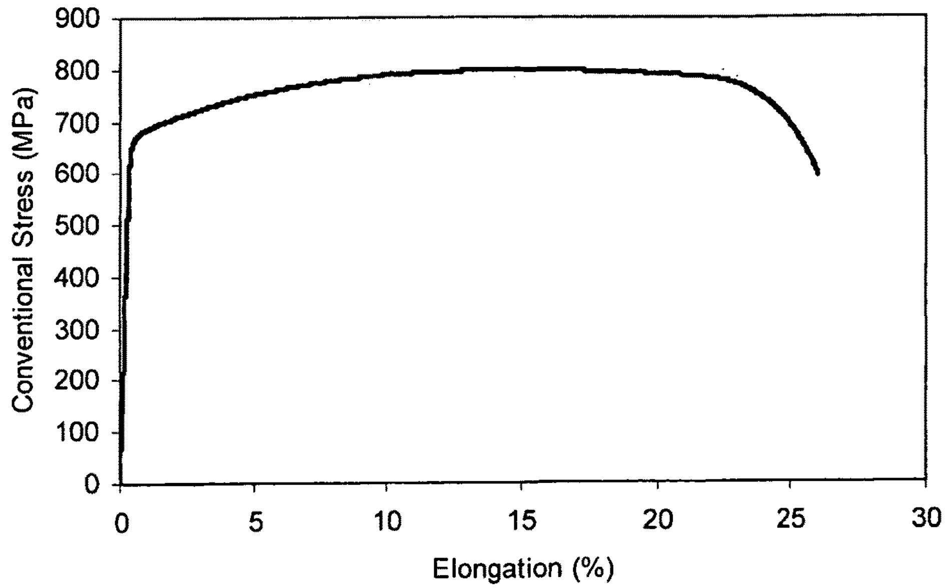
FIG. 2 illustrates the tensile curve of example A2 after cold-rolling and annealing.

The microstructure of the sheet A1 is illustrated by FIG. 1. Its tensile curve is shown on FIG. 2.

B2 is not according to the invention, due to untargeted microstructure and coating method. Its annealing temperature is out of target.

A5 did not undergo a pickling step while it has undergone only oxidation during annealing; as a consequence coating adherence and covering ratio are bad.

A6, B2, F2, F4 and G2 have undergone only reduction during the annealing; as a consequence, coating adherence and covering ratio results are bad.

For the steels according to the invention, in addition to good coatability via electro-galvanization (EG) or galvanization, the tensile strengths are higher than 1000−50×Al MPa, and their uniform elongation is greater than 15%. Furthermore, hole expansion is above 20% also.

The steel sheets according to the invention will be beneficially used for the manufacture of structural or safety parts in the automobile industry.

What is claimed is:

1. A cold rolled steel sheet comprising, by weight percent:

$0.1 \leq C \leq 0.5\%$;
$3.5 \leq Mn \leq 10.0\%$;
$Al \leq 9.0\%$;
$Si \leq 5.0\%$;
$0.5 \leq Si+Al \leq 9.0\%$;
$Ti \leq 0.2\%$;
$V \leq 0.2\%$;
$Nb \leq 0.2\%$;
$B \leq 0.0035\%$;
$Cr \leq 1\%$;
$S \leq 0.004\%$;
$P \leq 0.025\%$;

the remainder of the composition being iron and unavoidable impurities resulting from the smelting;

the microstructure including, as a surface fraction, 10% to 50% of austenite, 25% to 90% of ferrite, less than 5% of Kappa precipitates and less than 25% of martensite;

the sheet presenting from a top surface the successive following layers:

a top layer of metallic iron which thickness ranges from 50 to 300 nm; and a first under-layer made of metallic iron which contains one or more precipitates of oxides chosen among Mn, Si, Al, Cr and B, which thickness ranges from 1 to 8 μm.

2. The cold rolled steel sheet according to claim 1, further comprising a second under-layer, lying under said first under-layer, made of pure ferrite, which thickness ranges from 10 to 50 μm.

3. The cold rolled steel sheet according to claim 1, the steel composition having a manganese content of 5.0 to 9.0%.

4. The cold rolled steel sheet according to claim 1, the steel composition having a carbon content of 0.1 to 0.3%.

5. The cold rolled steel sheet according to claim 1, the steel composition having a carbon content of 0.15 to 0.25%.

6. The cold rolled steel sheet according to claim 1, the steel composition having an aluminum content of 1.5 to 9%.

7. The cold rolled steel sheet according to claim 1, the steel composition having an aluminum content of 5 to 8%.

8. The cold rolled steel sheet according to claim 1, the steel composition having a silicon content less than or equal to 1.5%.

9. The cold rolled steel sheet according to claim 1, the steel composition having a silicon content less than or equal to 0.3%.

10. The cold rolled steel sheet according to claim 1, the steel microstructure containing from 25 to 40% of austenite.

11. The cold rolled steel sheet according to claim 1, the steel microstructure containing from 50 to 85% of ferrite.

12. The cold rolled steel sheet according to claim 1, the steel microstructure including less than 15% of martensite.

13. The cold rolled steel sheet according to claim 1, the steel microstructure being free of kappa precipitates.

14. The cold rolled steel sheet according to claim 1, wherein the steel sheet has a tensile strength TS greater than or equal to 1000−50×% Al in MPa, a uniform elongation UE1 greater than or equal to 15% and a hole expansion HE greater than or equal to 20%.

15. A vehicle comprising:

a structural part made out of a steel sheet according to claim 1.

16. A metallic coated steel sheet comprising:

a cold rolled steel sheet according to claim 1; and a coating on the cold rolled steel sheet;

the coating applied via hot dip coating, electro-deposition or vacuum coating.

17. The metallic coated steel sheet according to claim 16, wherein the metallic coated steel sheet is heated treated.

18. The metallic coated steel sheet according to claim 16, wherein the sheet is galvannealed.

19. The metallic coated steel sheet according to claim 16, wherein the coating is applied via electro-deposition.

20. The metallic coated steel sheet according to claim 16, wherein the coated steel sheet has a tensile strength TS greater than or equal to 1000−50×% Al in MPa.

21. The metallic coated steel sheet according to claim 16, wherein the coated steel sheet has an elongation UE1 greater than or equal to 15%.

22. The metallic coated steel sheet according to claim 16, wherein the coated steel sheet has a hole expansion HE greater than or equal to 20%.

* * * * *